(12) United States Patent
Van De Kerkhof et al.

(10) Patent No.: US 8,896,817 B2
(45) Date of Patent: Nov. 25, 2014

(54) LITHOGRAPHIC PROJECTION APPARATUS, DEVICE MANUFACTURING METHODS AND MASK WITH SENSOR AND DIFFUSER FOR USE IN A DEVICE MANUFACTURING METHOD

(75) Inventors: Marcus Adrianus Van De Kerkhof, Helmond (NL); Bearrach Moest, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1395 days.

(21) Appl. No.: 11/545,763

(22) Filed: Oct. 11, 2006

(65) Prior Publication Data

US 2007/0091290 A1   Apr. 26, 2007

Related U.S. Application Data

(63) Continuation of application No. 11/246,551, filed on Oct. 11, 2005, now abandoned.

(51) Int. Cl.
*G03B 27/72* (2006.01)
*G03F 7/20* (2006.01)
*G03F 9/00* (2006.01)

(52) U.S. Cl.
CPC ............ *G03F 7/706* (2013.01); *G03F 7/70075* (2013.01); *G03F 9/7088* (2013.01); *G03F 9/7069* (2013.01)
USPC .......................................................... 355/71

(58) Field of Classification Search
USPC ...................... 355/71, 67, 53; 430/5
See application file for complete search history.

(56) References Cited

U.S. PATENT DOCUMENTS

| | | | |
|---|---|---|---|
| 6,940,587 B2 | 9/2005 | Van Der Laan et al. | |
| 6,977,717 B1 | 12/2005 | Lalovic et al. | |
| 2003/0081191 A1 | 5/2003 | Nishi et al. | |
| 2003/0197865 A1* | 10/2003 | Shiode | 356/399 |

FOREIGN PATENT DOCUMENTS

| | | |
|---|---|---|
| JP | 2003-075990 | 3/2003 |
| JP | 2003-214984 | 7/2003 |
| WO | 03/088329 A1 | 10/2003 |

OTHER PUBLICATIONS

Notice of Reasons for Rejection in related application JP2006-276040 mailed Oct. 15, 2009.

* cited by examiner

*Primary Examiner* — Chia-how Michael Liu
(74) *Attorney, Agent, or Firm* — Pillsbury Winthrop Shaw Pittman LLP

(57) ABSTRACT

During an alignment calibration process in a lithographic apparatus using a sensor to detect a property of a projected image at substrate level, a diffuser is inserted into the illumination beam to increase the range of angles of radiation incident on the substrate. Thereby it can be ensured that sufficient radiation enters the sensor even when there is a mismatch between the illumination mode used and the acceptance NA of the sensor.

7 Claims, 4 Drawing Sheets

LITHOGRAPHIC PROJECTION APPARATUS, DEVICE MANUFACTURING METHODS AND MASK WITH SENSOR AND DIFFUSER FOR USE IN A DEVICE MANUFACTURING METHOD

This application is a continuation of and claims priority to U.S. patent application Ser. No. 11/246,551 filed Oct. 11, 2005, now abandoned.

FIELD

The present invention relates to lithographic apparatus, to device manufacturing methods using lithographic apparatus, and to masks for use in such methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, an important factor in the yield, i.e. the percentage of correctly manufactured devices, is the accuracy within which layers are printed in relation to layers that have previously been formed. This is known as overlay and the overlay error budget will often be 10 nm or less. To achieve such accuracy, the substrate must be aligned to the mask pattern to be printed with great accuracy.

One known process for aligning the substrate and mask is known as off-line alignment and is performed in lithographic apparatus having separate measurement and exposure stations. It is a two-step process. First, at the measurement station, the positions of a plurality of, e.g. sixteen, alignment markers printed on the substrate relative to one or more fixed markers, known as fiducials and provided on the substrate table, are measured and stored. Then, the substrate table, with substrate still firmly fixed thereto, is transferred to the exposure station. The fiducial., as well as a marker detectable by an alignment sensor, also comprises a transmission image sensor (TIS). This is used to locate in space the position of an aerial image of a mask marker contained in the mask pattern that is to be exposed onto the substrate. Knowing the position of the TIS, and hence the fixed markers, relative to the image of the mask marker and also the positions of the substrate alignment markers relative to the fixed markers, it is possible to position the substrate in a desired position for correct exposure of the substrate to the mask pattern.

There are of course other known alignment methods, including through-the-lens methods in which an image of a grating mark on the mask is projected onto a grating mark on the substrate, or vice versa, using the projection system of the apparatus and alignment is detected by looking at the resulting diffracted light.

With the continual desire to image ever smaller patterns to create device with higher component densities, there is pressure to reduce overlay errors, which leads to a desire for improved alignment methods and systems.

SUMMARY

It is therefore desirable to provide improved alignment systems and methods for use in projection lithography.

According to an aspect of the invention, there is provided a lithographic projection apparatus comprising:
  an illumination system arranged to illuminate a patterning device with an illumination beam of radiation having a defined illumination profile;
  a projection system arranged to project an image of the patterning device onto a substrate;
  a sensor selectively positionable in place of said substrate and arranged to measure a property of the image projected by the projection system; and
  a diffuser selectively positionable in the path of said illumination beam and arranged to increase the range of angles at which radiation of the illumination beam is incident on the patterning device.

According to an aspect of the invention, there is provided a device manufacturing method using a lithographic projection apparatus having an illumination system arranged to illuminate a patterning device with an illumination beam, a projection system arranged to project an image of the patterning device onto a substrate and a sensor arranged to detect a property of an image projected by the projection system, the method comprising:
  setting the illumination system to illuminate the patterning device with an illumination beam having an illumination profile;
  inserting a diffuser into the path of the illumination beam so as to increase the range of angles at which radiation of the illumination beam is incident on a marker on the patterning device; and
  using the sensor to detect a property of an image of the marker projected by the projection system.

According to an aspect of the invention, there is provided a mask for use in a device manufacturing method using a lithographic apparatus, the mask comprising:
  a mask substrate;
  a pattern layer having a first area in which at least one device pattern is defined and a second area not overlapping said first area in which at least one marker pattern is defined; and
  a diffuser at least partly covering said second area and arranged to increase the range of angles of incidence of radiation illuminating the second area.

BRIEF DESCRIPTION OF THE DRAWINGS

Embodiments of the invention will now be described, by way of example only, with reference to the accompanying schematic drawings in which corresponding reference symbols indicate corresponding parts, in which.

Figure 1:
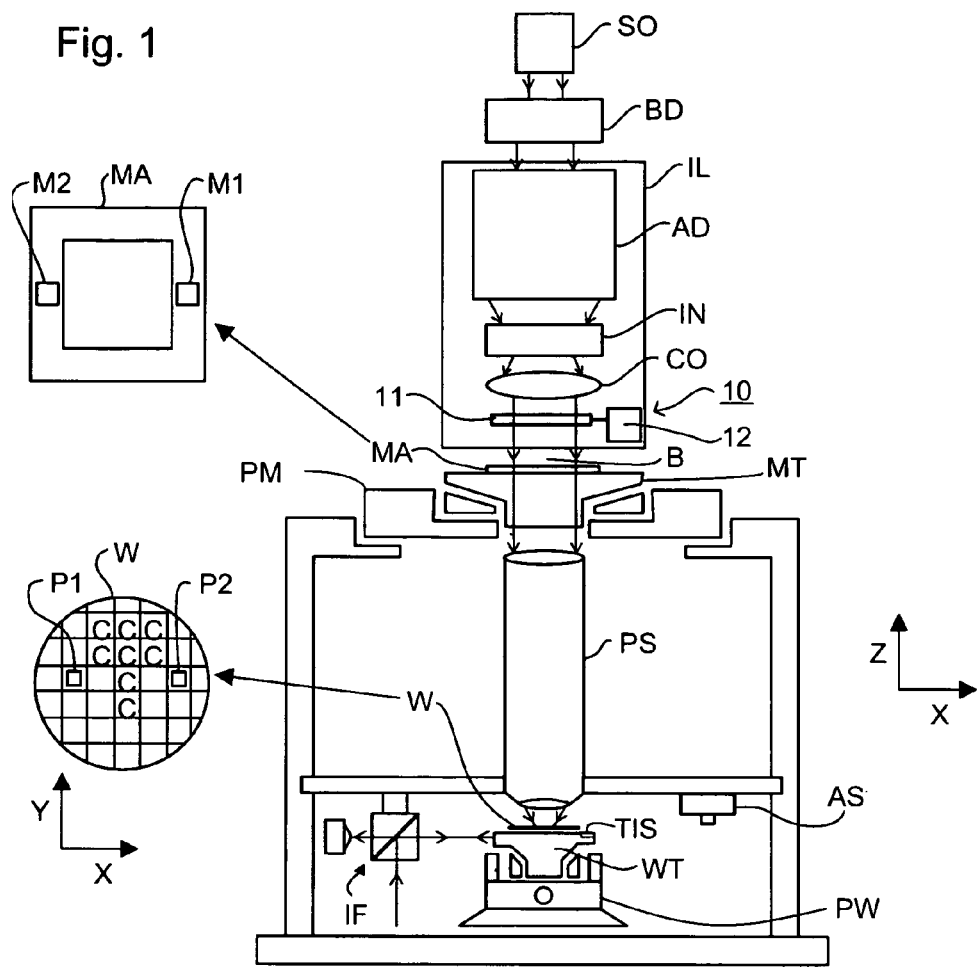
FIG. 1 depicts a lithographic apparatus according to an embodiment of the invention.

DETAILED DESCRIPTION an illumination system (illuminator) IL configured to condition a radiation beam B (e.g. UV radiation or DUV radiation);
  an illumination system (illuminator) L configured to condition a radiation beam B (e.g. UV radiation or DUV radiation).
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., moveable masking blades MB or mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
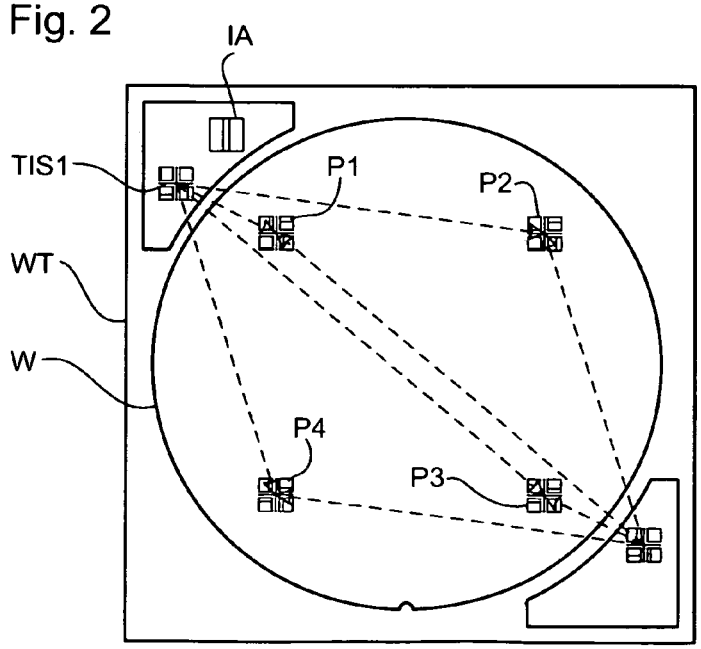
FIG. 2 depicts one arrangement of the substrate stage of the apparatus of FIG. 1.

The apparatus also comprises an alignment sensor AS, which may be mounted at the measurement station of a dual stage apparatus, which is used to detect alignment markers printed on a substrate W and also fixed markers (fiducials) provided on the substrate table. This can be seen in FIG. 2, which shows four alignment markers P1-P4 printed on the substrate and two fixed markers TIS1 and TIS2 provided on the substrate table WT. The substrate table may also have on it a sensor IA for an interferometric system that measures properties of the projection system, e.g. aberrations, and sensors for other systems that involve detection of a property of an image projected by projection system PL. By scanning the substrate table WT under the alignment sensor AS whilst keep track of its movements using the displacement measurement system IF, the positions, shown by dashed arrows, of the substrate markers P1-P4 relative to the fixed markers TIS1, TIS2 can be determined.

The fixed markers TIS1 and TIS2 have integrated into them an image sensor that can be used to determine the location of an image of a mask marker by scanning the image sensor through the aerial image. Thus, the relative position of the image of the mask marker and the fixed markers can be determined, and the previously obtained relative positions of the substrate markers allow the substrate to be positioned at any desired position relative to the projected image with great accuracy.

Figure 3:
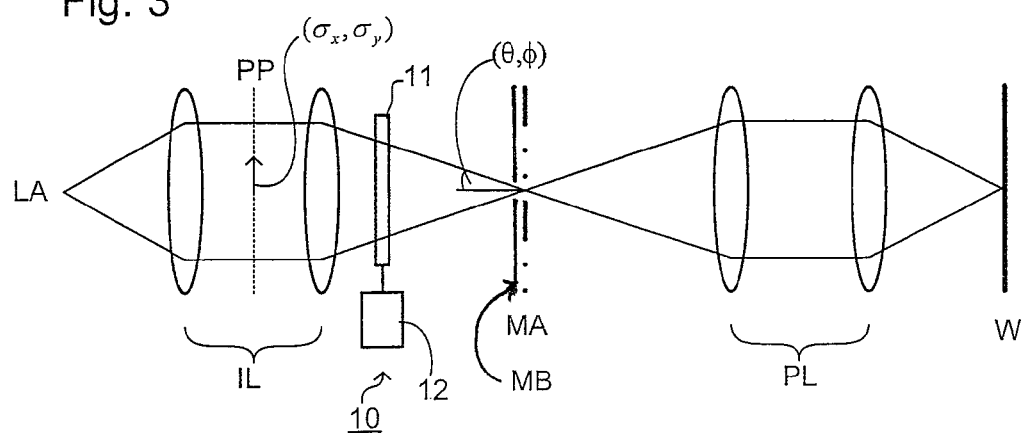
FIG. 3 depicts details of optical components of a lithographic apparatus.

One factor that influences the projected image of a mask pattern is the illumination profile of the mask, that is the angles from which radiation is incident on the mask. Most lithographic apparatus use the well-known Kohler illumination arrangement, which is illustrated schematically in FIG. 3. In such an arrangement, there is a plane, referred to as a pupil plane PP, (and sometimes multiple planes) in the illumination system IL that is a Fourier transform of the object plane of the projection system PL, in which the mask MA is located. As is well known, position in the pupil plane (expressed using normalized variables $\sigma_x$ and $\sigma_y$) translates to angle $(\theta, \phi)$ at the object plane so that the angular distribution of the illumination of the mask can be determined by defining an intensity distribution in the pupil plane. A variety of devices can be used to define the intensity distribution in the pupil plane, including zoom lenses, axicons, zoom-axicons, diffractive optical elements, masking blades and aperture plates.

Illumination profiles are commonly referred to by the shape of the intensity distribution in the pupil plane and include: conventional illumination (defined by a pupil filling factor often referred to as a σ-setting), annular illumination (defined by inner and outer radii, often referred to as $\sigma_i$ and $\sigma_o$), dipole illumination and quadrupole illumination as well as combinations of these and more complex distributions. A lithographic apparatus may be provided with devices to define standard illumination profiles, with or without adjustable parameters, that are suitable for imaging common patterns, or devices to define custom illumination profiles for specific patterns. The present invention may be used with any lithographic apparatus having one or more devices to control or adjust the illumination profile.

Figure 4:
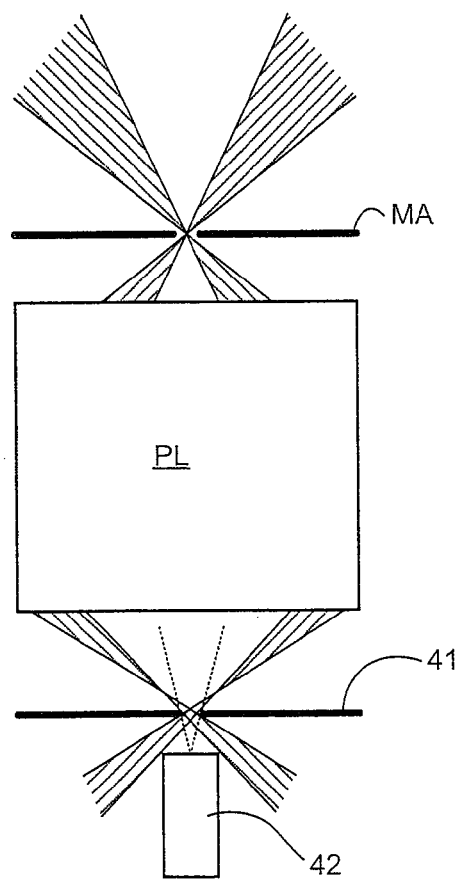
FIGS. 4 and 5 depict coupling of radiation into a sensor at substrate level without and with a diffuser positioned in the path of the projection beams.

As shown in FIG. 4, an image or other sensor in the substrate table may comprise an aperture plate 41 to define an aperture of specific size and shape and a transducer 42 for converting the incident radiation to an electrical signal. Because the aperture plate must have a non-negligible thickness and design constraints, such as the need to provide a photo-luminescent conversion layer to convert short wavelength radiation of the projection beam to a longer wavelength detectable by the transducer 42, the transducer 42 can only accept radiation incident in the aperture in a comparatively narrow range of angles, as indicated by dotted lines.

If the illumination mode used is one in which most of the radiation is incident on the mask at large angles of incidence, for example an annular illumination mode with a large $\sigma_i$ value or a dipole or quadrupole mode with poles close to the edge of the pupil plane, the result may be that little or no radiation is coupled into the transducer 42, as shown in FIG. 4. This can result in a low signal to noise ratio and other effects that reduce the accuracy of the resulting measurement. A reduction of accuracy can also occur even when sufficient radiation is coupled in to the transducer if the sensitivity of the transducer is not uniform with angle of incidence. In essence, a mismatch between the illumination mode and the acceptance NA of the sensor can lead to inaccuracies. This problem is exacerbated in that the reducing magnification (e.g. ¼ or ⅕) of the projection system increases angles of incidence at the substrate level.

One possibility for addressing this problem would be to set an illumination mode that is more compatible with the sensor whilst the necessary measurements are taking place and then revert to the desired, incompatible illumination mode for production exposures. However, depending on the device used to set the illumination mode, it can take a significant length of time to set an illumination mode and allow it to stabilize before exposures can be carried out. Thus this approach would lead to a loss of throughput.

Figure 5:
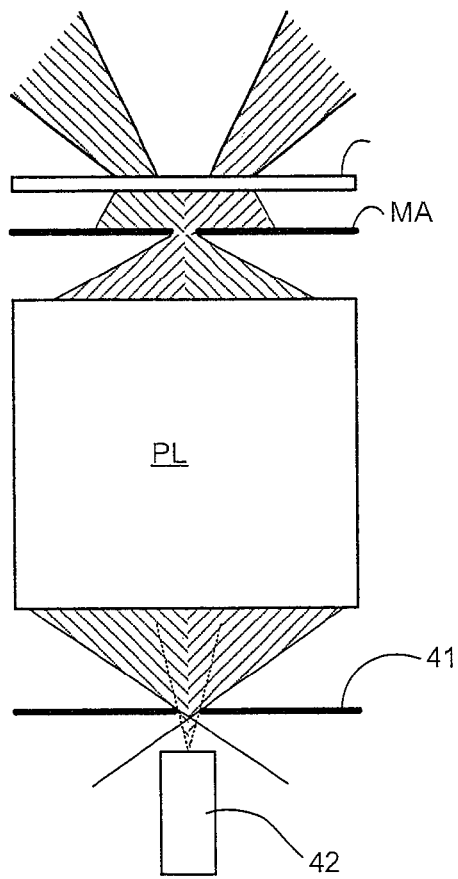

Therefore, in the embodiment of the invention depicted in FIG. 5, a diffuser module 10 is provided in the illumination system IL. The diffuser module comprises a diffuser 11 and an actuator system 12 by which the diffuser can be inserted into and removed from the path of the projection beam comparatively quickly. As shown in FIG. 5, the effect of the diffuser 11 is to increase the range of angles at which radiation is incident onto the mask and hence onto the sensor 41, 42. This can both ensure that sufficient radiation is coupled into the sensor and that there is sufficient uniformity of angle of incidence to mitigate the effect of any angle sensitivity of the sensor. Because the diffuser can be moved quickly into and out of the beam it can be inserted for measurements and removed for production exposures with no or reduced loss of throughput.

Although the diffuser is shown in the figures relatively near the mask MA, it can in fact be positioned in many places upstream of the mask, e.g., in the illumination system. In some cases it can be advantageous to position the diffuser near the mask so that movable mask masking blades MB can be used to control the area illuminated during measurements.

The form of the diffuser depends on the degree and nature of the mismatch between the illumination mode and the sensor acceptance range. In many cases, a glass or quartz plate with one or both surfaces randomly etched or ground to scatter radiation will be sufficient. In other cases, a diffraction or holographic pattern may be employed. The diffuser may also be arranged to scramble any polarisation of the illumination beam, e.g. by making it out of a birefringent material.

A further advantage of the diffuser is that the range of shapes in the aerial images that are measured decreases. This is caused by the fact that the similarity between the illumination pupils increases due to the diffuser. This means that the model function used to interpret the result of the measurement can be optimized far better than when all possible illumination modes have to be considered (especially keeping in mind modes like dipole illumination). This, in turn, improves the accuracy of the fit.

The advantages provided by the diffuser are particularly important for immersion lithography apparatus in which the NA of the system allows illumination modes beyond the critical angle of the sensor.

Figure 6:
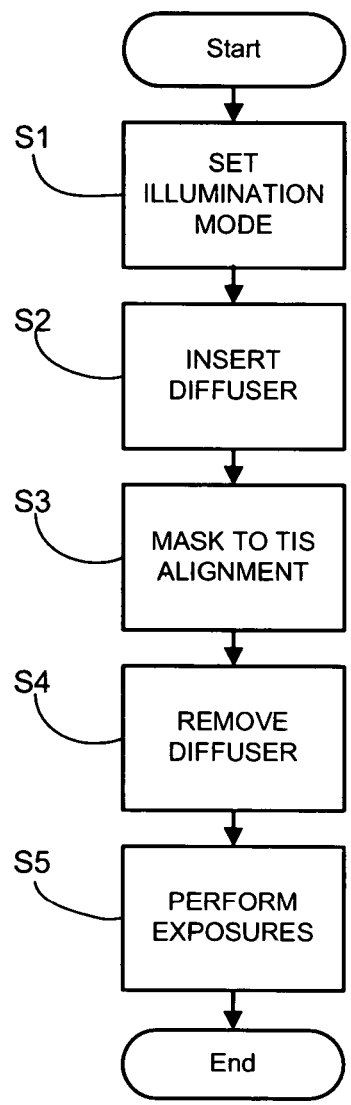
FIG. 6 depicts exemplary steps involved in a method according to an embodiment of the invention.
Figure 7:
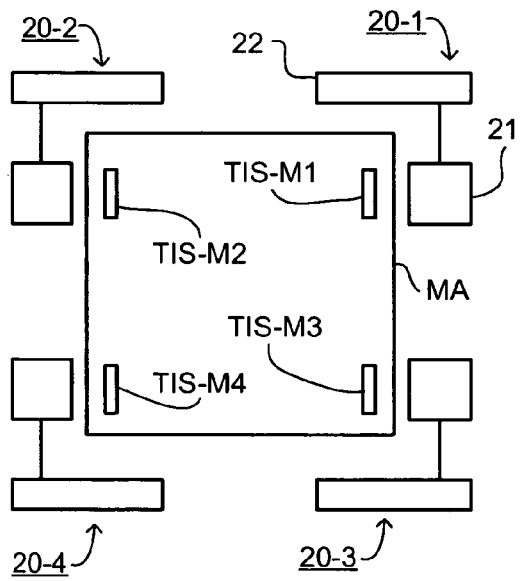
FIGS. 7 and 8 or 9 and 10 depict in plan and elevation operative views, respectively, the mask table of a second embodiment of the invention with diffusers in retracted for 7 and 8 and operative positions for 9 and 10.
Figure 9:
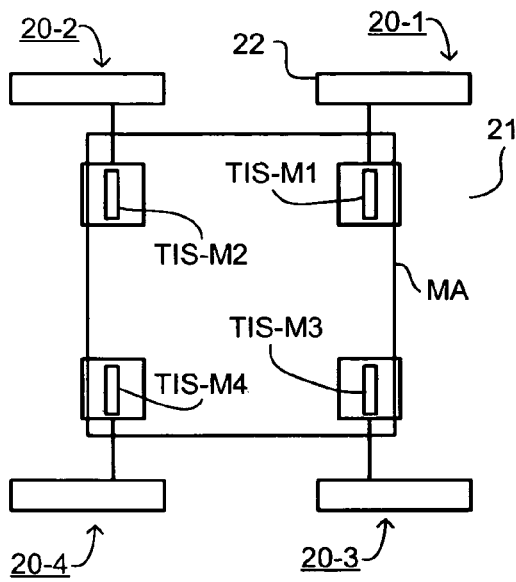
Figure 8:
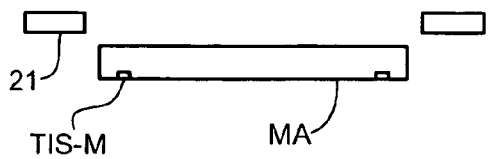
Figure 10:
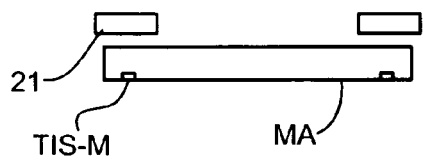

A method according to the invention is shown in FIG. 6—this comprises the following steps:
the desired illumination mode is set S1;
the diffuser is inserted into the path of the illumination beam S2;
the mask marker to TIS alignment process is carried out S3;
the diffuser is removed from the path of the projection beam S4; and
production exposures of one or more target portions of the substrate are performed S5.

Depending on the circumstances, the setting of the illumination mode may be performed in parallel with the insertion of the diffuser and/or the loading of a mask or substrate. Alternatively, the illumination mode may remain set form previous exposures of the same or a different substrate.

A second embodiment of the invention is shown in FIGS. 7 to 10. In this embodiment, diffusers localized to the positions of the mask markers TIS-M1 to TIS-M4 are employed. Four diffuser modules 20-1 to 20-4 are shown but more or fewer may be used according to the number of markers on the mask. Each diffuser module comprises a diffuser plate 21, which may be the same as the diffuser of the first embodiment, and an actuator system 22 arranged to move the diffuser plate between operative and retracted positions. In the operative positions, shown in FIGS. 9 and 10, the diffusers 21 cover their respective markers and diffuse the incident radiation thereon as required to match to the requirements of the sensor at substrate level. In their retracted positions shown in FIGS. 7 and 8, the diffusers do not hinder loading and unloading of the mask by a conventional mask robot. Depending on the relative positions of the mask markers and device pattern areas of the mask, it may be possible to leave the diffusers in position during production exposures.

Figure 11:
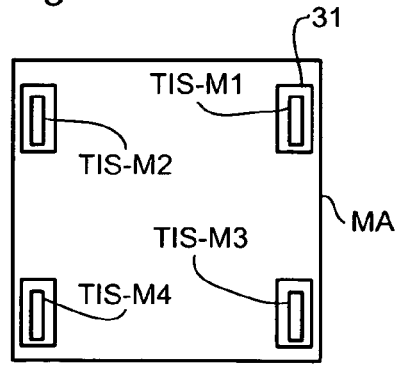
FIGS. 11 and 12 depict in plan and elevation a mask according to a third embodiment of the invention.
Figure 12:
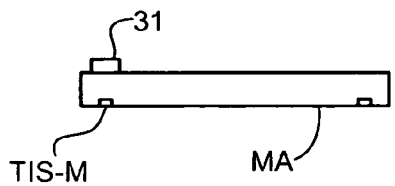

A third embodiment of the invention is shown in FIGS. 11 and 12. In this case the diffusers 31 are integrated with the mask MA, and again localized to the position of the mask markers rather than to the time of the measurement, as in the first embodiment. Because the diffusers 31 are integrated to the mask they can be made smaller and it can be ensured that they do not interfere with the production exposures. Most transparent masks comprise a substrate, e.g. of quartz, with a pattern layer, e.g. of chrome and/or a phase relief, on one side. In such a case, the diffuser is preferably located on the opposite side. This avoids damage to the pattern layer and spaces the diffuser from the pattern to improve the spreading of illumination angles. The diffuser may be an additional piece of material added to the mask or may be formed by surface treatment, e.g. etching or grinding, of the backside of the mask. Localized implantation of scattering centers may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
   an illumination system arranged to illuminate a patterning device with an illumination beam of radiation having a defined illumination profile, the defined illumination profile comprising a range of illumination angles of incidence and the patterning device including a plurality of markers;
   a projection system arranged to project an image of the patterning device onto a substrate;
   a sensor selectively positionable in place of said substrate and arranged to measure a property of the image over a range of acceptance angles of incidence projected by the projection system, the range of acceptance angles of incidence being narrower than the range of illumination angles of incidence of the defined illumination profile;
   a plurality of diffuser modules, each one of said plurality of diffuser modules associated with a respective one of said plurality of markers, and each one of said plurality of diffuser modules comprising a respective diffuser plate and an associated actuator system;
   each diffuser plate configured to be selectively positioned with respect to the patterning device by its said associated actuator system into the path of said illumination beam and over said associated one of said plurality of markers on said patterning device and configured to be selectively removed with respect to the patterning device by said associated actuator system from the path of said illumination beam and from being over said associated one of said plurality of markers on said patterning device,
   and wherein, when each diffuser plate is positioned with respect to the patterning device into the path of said illumination beam and over said associated one of said plurality of markers, each diffuser plate is arranged to increase the range of angles at which radiation of the illumination beam is incident on the associated marker on the patterning device and detected by the sensor such that angular sensitivity of the sensor is mitigated.

2. The apparatus according to claim 1, wherein each diffuser plate of said plurality of diffuser modules is disposed proximate to said associated one of said plurality of markers of the patterning device when each diffuser plate is out of the path of said illumination beam.

3. The apparatus according to claim 1, wherein each of said plurality of diffuser modules is arranged to diffuse light such that light arrives at said sensor across substantially all of said range of acceptance angles of incidence.

4. The apparatus according to claim 1, wherein each diffuser plate is configured to be selectively positioned onto said associated one of said plurality of markers and configured to be selectively removed from said associated one of said plurality of markers on said patterning device by its said associated actuator system.

5. The apparatus according to claim 1, wherein the illumination system includes a pupil plane that is a Fourier transform of an object plane containing the patterning device and wherein at least one diffuser plate is selectively positionable in a plane that is not conjugate with either the pupil plane or the object plane.

6. The apparatus according to claim 5, wherein the illumination system comprises moveable masking blades arranged to define the area of the patterning device that is illuminated by the illumination beam, and wherein each diffuser plate is proximate the moveable masking blades.

7. The apparatus according to claim 1, wherein the sensor comprises a transmission image sensor.

* * * * *